United States Patent [19]

Hamlin

[11] 4,142,194
[45] Feb. 27, 1979

[54] WEB PROCESSOR

[75] Inventor: James S. Hamlin, Cherry Hill, N.J.

[73] Assignee: E. I. Du Pont de Nemours and Company, Wilmington, Del.

[21] Appl. No.: 830,477

[22] Filed: Sep. 6, 1977

Related U.S. Application Data

[63] Continuation of Ser. No. 656,358, Feb. 9, 1976, abandoned.

[51] Int. Cl.$^2$ ............................................. G03D 5/00
[52] U.S. Cl. .................................. 354/318; 354/319; 354/325
[58] Field of Search .............. 354/318, 317, 319, 325; 118/259, 224

[56] References Cited

U.S. PATENT DOCUMENTS

| | | | |
|---|---|---|---|
| 3,299,791 | 1/1967 | Fukuda | 354/318 |
| 3,307,466 | 3/1967 | Fukuda | 354/318 |
| 3,682,078 | 8/1972 | Parker et al. | 354/317 |
| 3,753,419 | 8/1973 | Fukushima et al. | 355/10 X |

FOREIGN PATENT DOCUMENTS 43-26703  8/1964  Japan ........................................ 354/318

Primary Examiner—R. L. Moses

[57] ABSTRACT

A processor for photopolymerizable films is described. In this processor, film is fed, image up, in a straight through path by a series of soft rubber covered transport rollers first into a development section, then to a rinse section, and finally to a dryer section. In the developer section, developer is delivered through spray pipes which maintain a curtain of developer cascading over the top rolls at both the entrance and exit of the developer section. The film is thus maintained flooded in a precisely controlled, well defined surface region such that the time in which the film undergoes development may be accurately controlled by varying film speed. The film is then rinsed in the rinse section by a high impact spray system and then dried.

6 Claims, 3 Drawing Figures

WEB PROCESSOR

This is a continuation, of application Ser. No. 656,358 filed Feb. 9, 1976, now abandoned.

BACKGROUND OF THE INVENTION

This invention relates to apparatus for processing web materials and, more particularly, to an apparatus for accurately controlling the processing time of web materials.

In the graphic arts field a mask containing an image opaque to actinic radiation often is used in preparing a printing plate both for letterpress and lithographic work. Such a mask is also used to prepare the initial contact or half tone films used for the subsequent preparation of printing plates. A similar mask is used in the preparation of printed circuit boards using photoresist materials. Film masks are known in the form of individual sheets or a continuous web, in which a base or substrate, typically plastic, is coated with a photosensitive (often resist-forming) material and is exposed to actinic radiation through a suitable half-tone mask. After exposure the film is treated with a processing portion depending upon the particular materials used.

Processing typically involves the so-called developing step in which the exposed photosensitive layer is either softened or hardened so that the soft or loose material may be removed. The next step is the washing or rinsing step whereby the softened regions are removed from the film typically by a high pressure spray. Following this the film is dryed.

In recent years some of the materials used in the photosensitive layers of the films and plates have been rapidly processable materials which reduce the processing time required. Furthermore, some of these materials are relatively soft and extremely sensitive to pressure marks which can be caused if the film is folded or bent during the processing.

With such rapidly processable materials, it is necessary to devise a processor which is capable of accurately and precisely controlling the development time such that various areas of the film are neither overdeveloped nor underdeveloped. Most prior art processors are not capable of such accurate control of processing time particularly when relatively short development times, typically a matter of a few seconds, are involved. Furthermore most processors of the prior art tend to have "turnarounds" which in bending the film back on itself tend to mark and otherwise damage, and hence lower the quality of, the films used.

Among the known prior art processors is one described in U.S. Pat. No. 2,404,138 issued July 16, 1946 to A .L. Mayer. The disadvantage of the Mayer processor is that the precise development time cannot be controlled accurately because the developer is not accurately and precisely applied to and removed from the film. There is no well defined starting and stopping point for the development process relative to the surface area of the film. Another system is that described in U.S. Pat. No. 3,448,720 issued June 10, 1969 to R. C. Graham. Here again the development time cannot be well defined or controlled, since there is no means of ensuring that the development chemicals cover a precisely defined surface of the film or plates. Still another system is that described in U.S. Pat. No. 3,710,703 issued Jan. 16, 1973 to Bruno et al. This system in addition to suffering from the inability to precisely control the development time, subjects the film to a tortuous path which tends to mark the film. Another U.S. Pat. No. 3,589,261 issued June 29, 1971 to Costas Krikelis, describes a system which although quite satisfactory for the purposes for which it was designed, has many of these same deficiencies.

Accordingly, it is an object of this invention to obviate many of the disadvantages of the prior art photosensitive material processors.

Another object of this invention is to provide an improved apparatus for precisely controlling the development time of a photosensitive material.

SUMMARY OF THE INVENTION

In a preferred embodiment of this invention, an apparatus is constructed having first and second contiguous sections for processing a photosensitive layer on one side of a substrate comprising drive means for moving the substrate through the sections, layer side up, entrance means in the first section for applying a substantially uniform curtain of a fluid processing material to said layer as said substrate enters the first section for modifying portions of said layer, exit means in said first section for applying a uniform curtain of said fluid processing chemical to the layer prior to said substrate leaving the first section, and rinse means in the second section for rinsing said layer.

In a particularly preferred embodiment, the drive means moves the substrate along a path approximating a straight line so as to avoid turnarounds and/or discontinuities which could cause damage to the layer. Further the entrance and exit means each include a roll that contacts the layer and dispensing means for cascading said fluid processing chemical over the rolls and onto the layer, thereby forming a pool of the processing material over a precisely defined length of substrate moving between the rollers. Thus, by adjusting the speed at which the substrate moves between the rolls, the development time is precisely controlled. The substrate receives the processing material immediately upon its entry through the entrance roller and is continually subjected to the material until it passes out the exit roller. In this manner, even though the layer on the substrate may be exposed to the developing chemical only a matter of a very few seconds, such exposure time is accurately controlled.

BRIEF DESCRIPTION OF THE DRAWINGS

Further advantages and features of this invention will become apparent upon consideration of the following description wherein.

DESCRIPTION OF THE PREFERRED EMBODIMENT

Figure 1:
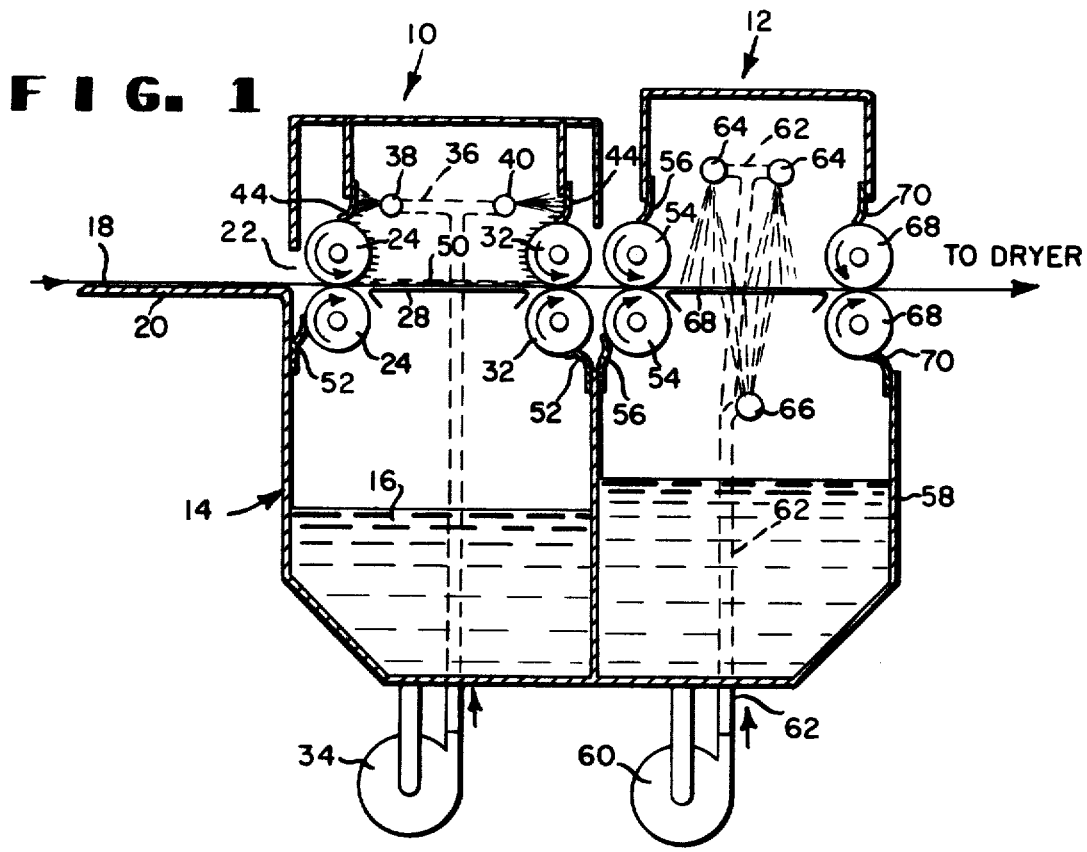
FIG. 1 is a cross-sectional, side elevation view of an apparatus for processing substrates constructed in accordance with a preferred embodiment of this invention.

The apparatus of this invention will be described, for purposes of illustration only, with reference to processing a photopolymer lithographic film such as that described in pending U.S. application Ser. No. 632,726 filed Nov. 17, 1975 by Bratt & Cohen. It is understood that the apparatus may be used in any application where it is necessary or desirable to process a layer on a substrate.

As described in said Bratt & Cohen application, a photosensitive element or film comprises a support bearing a photohardenable layer which has an optical density in the actinic region of at least three, is no more than 0.0006 inch thick and is the outer most layer of the element or is contiguous to a removable cover sheet or layer. The photohardenable layer is comprised of a material selected from photopolymerizable, photocrosslinkable, and photodimerizable materials. A typical photopolymerizable material is comprised of a photoinitiator, an antinic radiation absorber, a polymerizable monomer and a polymeric binder all of known type. Such photopolymer film is designed to be processed utilizing the apparatus of this invention which includes development, rinsing and optionally drying steps all in an automatic and continuous manner.

The materials typically employed for this sort of polymer film, which may be broadly described as a litho film, typically are relatively soft and easily damaged or marked in any processor. It is for this reason that a straight through processing apparatus is desired wherein the film is not subjected to turnarounds, bending and the like. Furthermore, the number of surfaces against which the photosensitive layer side of the film must have contact should be reduced to an absolute minimum and all such surfaces optimally should be moved at the same speed as the film such that there is little or no relative motion therebetween.

As used herein, the term "film" is intended to mean either an individual sheet or, for that matter, a continuous web or even plates as typically used in the graphic arts industry, the common denominator being that each contain a substrate with a photosensitive layer which is to be processed and portions thereof removed to provide the so-called developed image or artwork.

The processing apparatus itself includes a developing section 10 and a rinsing section 12. The film may be passed from the output of the rinsing section to a dryer (not shown) which may be of conventional design forming no part of this invention. The dryer may be a straight through section configured the same as the rinse section 12 but with heaters ininstead of rinse sprays.

The developer section 10 includes a chamber 14 adapted to hold a film processing chemical 16 such as any of those typically used to process a film 18 having a previously exposed photosensitive layer on the upper a portion thereof. The film 18 is placed layer side up on a loading platform 20 and then fed through an entrance slot 22 to a pair of entrance transport or nip rolls 24. The upper roll (in the drawing) of the nip rolls 24 is free-wheeling and allowed to contact the lower roll and/or the upper surface or layer of the film 18. The upper roll is driven by frictional contact with the lower roll, which is driven, and to some extent by the movement of the film by frictional contact with the film.

From the nip rolls 24 the film 18 is passed onto a horizontally disposed film guide 28. Preferably the film guide is wire formed so as to minimize interference with the various fluids, air and the like. Furthermore the wire guide is preferably covered with a plastic coating material to reduce film friction and film scratching. Any suitable plastic which is non-reactive with the chemicals used may be employed.

Figure 3:
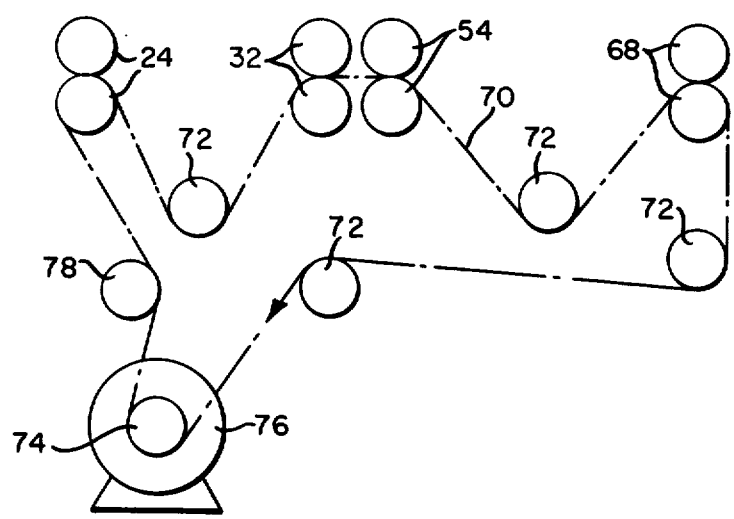
FIG. 3 is a diagrammatic representation of a drive system for the rollers that may be used in the apparatus illustrated in FIG. 1.

As a next step, the film is passed through a pair of exit transport or nip rolls 32. The lower roll (in the drawing) of the nip rolls 32 is driven, as depicted in FIG. 3, while the upper (in the drawing) of the nip rolls 32 is driven by frictional contact with the lower roll and the upper surface of the film or substrate 18 as was described in connection with the entrance rolls 24. Thereafter the film leaves the developer section 10 and passes into the rinse section 12. The nip rolls 24 and 32 may be constructed of any soft material such as rubber, foam rubber and the like which are typically used in the processing of photographic materials. In this manner they can contact with a squeegee-type action which aids in driving the upper rolls.

Figure 2:
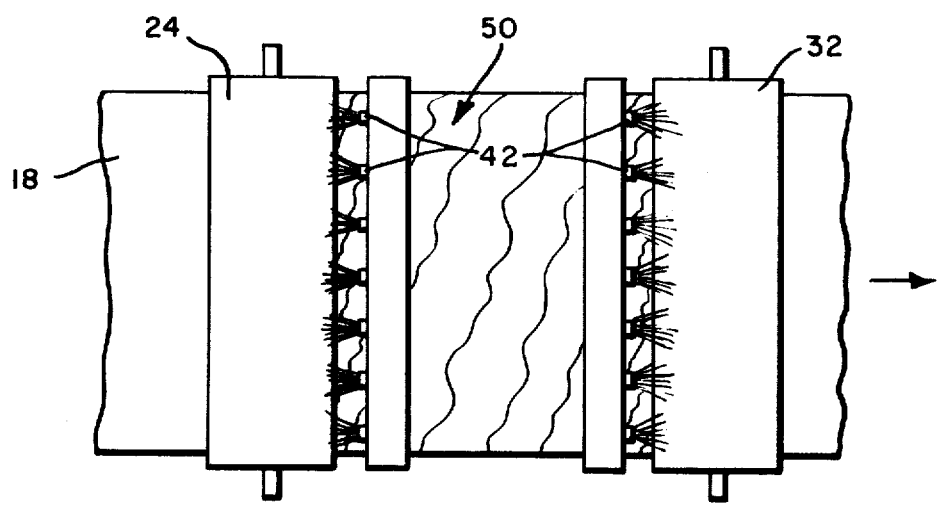
FIG. 2 is a fragmentary plan view of the developer section of the apparatus illustrated in FIG. 1, depicting a film strip passing through the developer section.

In accordance with this invention, the residence time and hence the exposure time of the film to the fluid processing chemicals is precisely and accurately controlled as will be described. The chemicals 16 are pumped by means of a pump 34 through suitable conduits 36 to each of an entrance spray bar 38 and an exit spray bar 40. The spray bars are perhaps most clearly seen in FIG. 2 extend across the width of the film 18 (or rolls 24 and 32) as it passes through the developer section 10. Each spray bar 38 and 40 has a plurality of nozzles 42 which direct the fluid against upper flexible wipers 44, which contact the respective upper nip rolls 24 and 32, or onto the rolls directly. The wipers 44 preferably may be constructed of rubber or similar material. This keeps the developer in the compartment 14 and permits it to cascade over the upper rolls and down onto the film 18 as it passes under the rolls. In this manner, the moment that the film 18 enters the developer section 10, it is immediately, accurately and simultaneously, across its entire width, subjected to a curtain of cascading developer in a relatively straight line perpendicular to the direction of motion of the film 18. This permits the formation thereon of a puddle or pool 50 of the processing material covering substantially the entire region of the film between the entrance transport rolls 24 and the exit transport rolls 32 and no place else. The nip rolls prevent the processing material from spreading beyond the entrance and exit of the developer section.

To insure that the entire film including leading and trailing portions of the film are supplied with adequate chemicals, the cascading fluid from the upper roll of the exit nip rolls 32 further wets the entire film. This defines a rather sharp cutoff point as the exit nip rolls 32 squeeze out the fluid at a precisely defined point, i.e., the point at which the nip rolls contact. Thus the period of time during which the film is subjected to the action of the developer is determined by the speed with which the film is moved through the developer section. The film area which is subjected to the developing action at any one point in time is defined by the longitudinal spacing between the nip rolls and the side edges of the film. Since in a typical case, the film would be travelling at a relatively high rate of speed and the distance between the nip rolls typically may be relatively short, in the order of 6 inches, the developing time may be in the order of two to three seconds. This precise control was very difficult if not impossible using the film processors of the prior art, since not all portions of the film were simultaneously wetted and subjected to the treatment during the entire time that it was in the developer section.

To complete the description of the developer section, the lower rolls of the nip roll 24 and 32 each are contacted by a flexible wiper 52 attached to the walls of the developer compartment 14. These wipers aid in maintaining the developer within the compartment 14 so that it falls to the bottom of the compartment 14 for recirculation by the pump 34 through the spray bars.

The film upon leaving the developer section, moving in a straight line path, passes through a pair of entrance transport or nip rolls 54 in the rinse section 12. The nip rolls 54 may be constructed quite similarly to those in the developer section. They are also provided with wipers 56 which maintain any rinse water within the rinse section 12. Thus, the rinse section is seen to include the compartment 58 with a pump 60 which recirculates the fluid through the line 62 to upper spray bars 64 which direct a high pressure, high velocity spray downwardly directly onto the upper surface of the film 18. This serves to dislodge and remove any softened or loose material resulting from the developer action from the surface of the film. A lower spray bar 66 typically operating at a reduced pressure, directs a spray upwardly towards the bottom or lower surface of the film. The spray is directed through a transport film guide 68 which supports the film and may be constructed of wires in a manner similar to the film guide 28 in the developer section 10.

To complete the rinse section, a pair of exit nip rolls 68, provided with appropriate wipers 70, retain fluid within the rinse section itself. Preferably both of the entrance and exit nip rolls 54 and 68 may be of the same type as the nip rolls employed in the developer section. In this instance, however, the exit rolls 68 preferably are surfaced with a material which absorbs moisture easily; for example, they may be covered with a suitable cloth to aid in drying the film prior to its departure from the rinse section. Upon leaving the rinse section, the film is directed to a suitable dryer (not shown) which may have heated air flowing therethrough to facilitate in the drying of the film. Preferably the straight line flow path through the dryer is preserved although this is in most cases not essential once the development and rinse has taken place.

The drive system for the processor may be seen in FIG. 3 in which the several nip rolls 24, 32, 54 and 68 are illustrated. The lower of the nip rolls in each instance is provided with a suitable sprocket to be driven by a suitable chain drive 70. To provide the proper linkage, idler wheels 72 aid in connecting the chain 70 to the drive sprocket 74 which in turn is driven by a suitable variable speed motor 76. A tension takeup wheel 78 which may be spring biased, is also provided.

In each instance, the lower of each of the nip rolls is the drive mechanism and each of the nip rolls is in alignment to provide a straight line path for the film therethrough thus to avoid any bending or curvature of the film. The apparatus provides the advantages of agitated immersion development without the disadvantage of guiding the developed element into and out of a bath which due to the many tortuous turns and twists required, tends to mark and damage many soft film layers.

In general the chamber structural parts may be made of various chemical resistant plastics and non-corrodible metal or metal alloys; i.e., steel, stainless steel, brass, copper, bronze, aluminum, etc., are appropriate. The rollers can be made of the foregoing structural materials and preferably, as described, are coated with rubber, synthetic elastomers, silicone, resins, etc.

I claim:

1. Apparatus having first and second contiguous sections for processing a photosensitive layer on a substrate comprising, in combination, drive means for moving said substrate through said sections, layer side up, said drive means including nip roll pairs at the entrance and exit of each processing section, first and second fluid supply means for applying substantially uniform curtains of a fluid processing material to said layer at the entrance and exit of said first section for establishing and maintaining a uniform pool of said fluid processing material across said layer from said entrance to said exit, and rinse means in said second section for rinsing said layer, each of said fluid supply means including a barrier means extending longitudinally of the upper roll in each pair within said first section for preventing the escape of processing material.

2. Apparatus according to claim 1 wherein said drive means moves said substrate along a path approximating a straight line.

3. Apparatus according to claim 2 wherein said drive means includes a support for said web, said support having wires lying in a horizontal plane, said wires being substantially parallel to said straight line.

4. Apparatus according to claim 1 wherein said rinse means includes water impact sprays for removing loose portions from said substrate.

5. Apparatus according to claim 4 wherein said water impact sprays include a first spray operated at a first pressure directed to the under side of said substrate and a second spray operated at a second pressure greater than said first pressure directed to the layer side of said substrate.

6. Apparatus according to claim 1 wherein said barrier means is a wiper located above but contacting the upper roll and each fluid supply means also includes a dispenser of fluid processing material directed at its wiper.

* * * * *